(12) United States Patent
Sion et al.

(10) Patent No.: US 6,572,371 B1
(45) Date of Patent: Jun. 3, 2003

(54) GAS PREHEATER AND PROCESS FOR CONTROLLING DISTRIBUTION OF PREHEATED REACTIVE GAS IN A CVI FURNACE FOR DENSIFICATION OF POROUS ANNULAR SUBSTRATES

(75) Inventors: Eric Sion, Lyons (FR); Yvan Baudry, Hebron, KY (US)

(73) Assignee: Messier-Bugatti, Velizy Villacoublay (FR)

( * ) Notice: Subject to any disclaimer, the term of this patent is extended or adjusted under 35 U.S.C. 154(b) by 0 days.

(21) Appl. No.: 10/139,553

(22) Filed: May 6, 2002

(51) Int. Cl.[7] .................................................. F27D 1/10
(52) U.S. Cl. ........................ 432/247; 432/241; 118/725; 118/724
(58) Field of Search ................................. 432/120, 159, 432/241, 247; 219/209, 390, 399, 405; 438/660, 663, 715; 118/50.1, 724, 725, 726, 732

(56) References Cited
U.S. PATENT DOCUMENTS 6,109,209 A   8/2000   Rudolph et al. ............. 118/724

Primary Examiner—Gregory Wilson
(74) Attorney, Agent, or Firm—Weingarten, Schurgin, Gagnebin & Lebovici LLP

(57) ABSTRACT

A gas preheater for a CVI furnace designed for the densification of annular porous substrates arranged in a plurality of vertical annular stacks of substrates, comprising: a sleeve made of heat conductive material resting upon the bottom wall of a susceptor and delimiting a gas preheating chamber, with a gas inlet opening in the gas preheating chamber; a heat exchange assembly located in the gas preheating chamber; a gas distribution plate resting upon the sleeve, covering the gas preheating chamber and provided with a plurality of passages for preheated gas; a load supporting plate for supporting stacks of annular substrates and provided with a plurality of passages in communication with respective passages of the gas distribution plate and registration with internal volumes of respective stacks of annular substrates; and nozzles inserted in passages communicating the gas preheating zone with the internal volumes of respective stacks of annular substrates for adjusting the flows of preheated gas respectively admitted in said internal volumes.

17 Claims, 4 Drawing Sheets

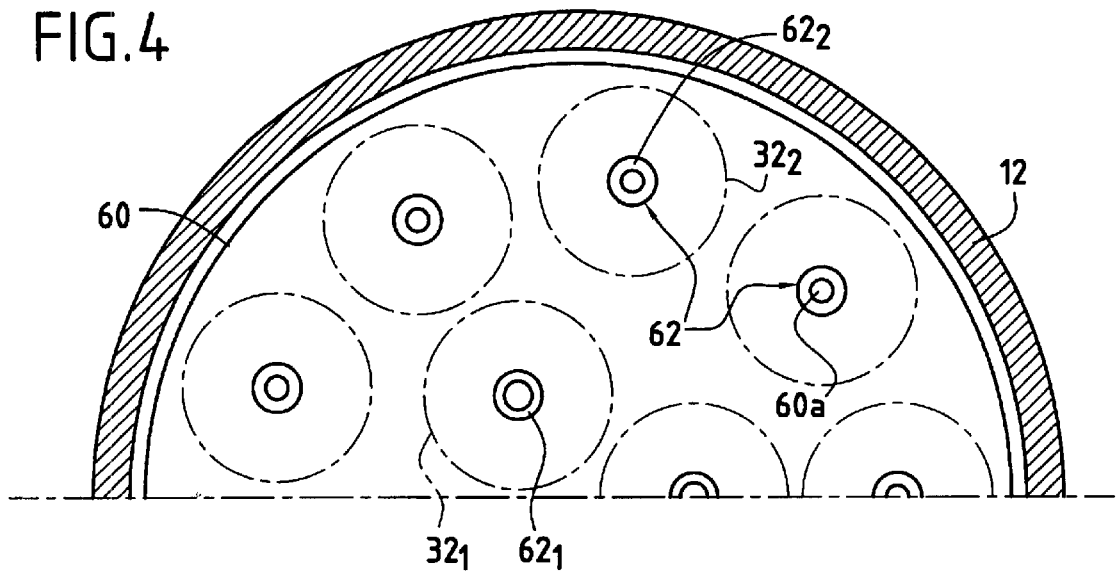
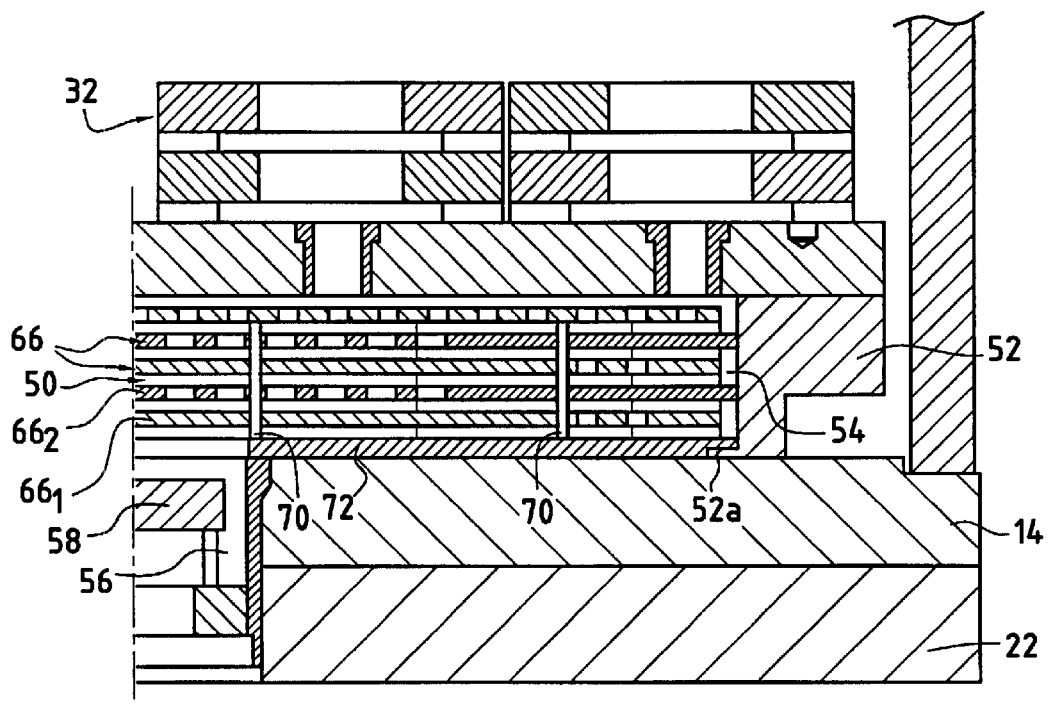

GAS PREHEATER AND PROCESS FOR CONTROLLING DISTRIBUTION OF PREHEATED REACTIVE GAS IN A CVI FURNACE FOR DENSIFICATION OF POROUS ANNULAR SUBSTRATES

BACKGROUND OF THE INVENTION

The invention relates to densification of porous annular substrates by chemical vapor infiltration (CVI).

A particular field of application of the invention is the making of annular parts in a thermostructural composite material, such as carbon/carbon (C/C) composite brake discs for airplanes or land vehicles.

Thermostructural composite materials are remarkable because they possess mechanical properties that enable them to be used for making structural parts and have the ability to conserve these properties at high temperatures. Typical examples of thermostructural composite materials are C/C composite materials having a reinforcing fibrous texture of carbon fibers densified by a pyrolytic carbon matrix, and ceramic matrix composites (CMCs) having a reinforcing texture of refractory fibers (carbon or ceramic) densified by a ceramic matrix.

In a CVI process, substrates to be densified are placed in a reaction chamber of a furnace in which they are heated. A reactive gas containing one or more gaseous precursors of the material that is to constitute the matrix is introduced into the reaction chamber. The temperature and pressure inside the reaction chamber are adjusted to enable the reactive gas to diffuse within the pores of the substrate and deposit the matrix-constituting material therein by one or more components of the reactive gas decomposing or reacting together. The process is performed under low pressure in order to enhance diffusion of the reactive gas into the substrates. The temperature at which the precursor(s) is transformed to form the matrix material, such as pyrolytic carbon or ceramic, is usually greater than 900° C., and is typically close to 1000° C.

In order to enable substrates throughout the reaction chamber to be densified as uniformly as possible, whether in terms of increasing density or in terms of microstructure of the matrix material deposited, it would ideally be necessary to have a substantially uniform temperature within the reaction chamber and to allow the reactive gas to reach all substrates relatively uniformly.

CVI furnaces usually include a gas preheater situated inside the furnace between the reactive gas inlet into the furnace and the reaction chamber. Typically, a gas preheater zone comprises a heat exchange assembly in the form of a plurality of perforated plates through which the reactive gas passes before entering the reaction chamber.

The substrates, like the heat-exchange assembly, are heated because they are located in the furnace. The latter is generally heated by means of a susceptor, e.g. made of graphite. The susceptor defines the side of the wall of the reaction chamber and is heated by inductive coupling with an inductor surrounding the reaction chamber or by resistors surrounding the furnace.

The applicants have found that the efficiency of the gas preheater is not always as good as desired. A significant example is that of densifying porous substrates constituted by annular preforms of carbon fibers or pre-densified annular blanks for use in making C/C composite brake disks.

The annular substrates are loaded in vertical stacks in the reaction chamber above the gas preheater which is situated at the bottom of the furnace. In spite of the reactive gas being preheated, a temperature gradient is often observed in the reaction chamber, with the temperature close to substrates situated at the bottom of the stacks possible being several tens of ° C. lower than the temperature that applies in the remainder of the stacks. This may give rise to a large densification gradient between the substrates in a same stack, depending on the position of a substrate within the stack.

In order to solve that problem, it would be possible to increase the efficiency with which the reactive gas is preheated by increasing the size of the gas preheater. However, for a given volume of the furnace, that would reduce the loading capacity for the substrates. Since CVI processes require large amounts of industrial investment and long processing time, it is highly desirable for furnaces to have the highest possible productivity, and thus as high as possible a ratio of volume dedicated to the load of substrates over the volume dedicated to preheating the reactive gas.

Another problem resides in the fact that a temperature gradient is observed not only in the vertical direction, along the stacks of substrates, but also in the horizontal direction, between different stacks. In particular, it has been noted that stacks located in a central part of the reaction chamber may not benefit from the heat radiated by the susceptor in the same way as stacks located closer to the internal side wall of the susceptor.

This also results in a gradient of densification between substrates belonging to different stacks.

OBJECTS AND SUMMARY OF THE INVENTION

An object of the invention is generally to provide means for achieving an efficient and cost effective substantially uniform densification of porous annular substrates in a CVI furnace.

A particular object of the invention is to provide a gas preheater which allows such a substantially uniform densification to be achieved without significantly affecting the productivity of the CVI substrate.

According to one aspect of the invention, in a CVI furnace for the densification of annular porous substrates arranged in a plurality of vertical annular stacks of substrates, comprising a susceptor having an internal side wall delimiting a gas preheating zone and a reaction chamber within the furnace and a bottom wall, and at least one gas inlet opening through the bottom wall of the susceptor, a gas preheater is provided which comprises:

a sleeve made of heat conductive material resting upon the susceptor bottom wall and delimiting a gas preheating chamber, with the at least one gas inlet opening in the gas preheating chamber, a heat exchange assembly located in the gas preheating chamber, a gas distribution plate resting upon the sleeve, covering the gas preheating chamber and provided with a plurality of passages for pre-heated gas, a load supporting plate for supporting stacks of annular substrates to be loaded in the reaction chamber for densification and provided with a plurality of passages in communication with respective passages of the gas distribution plate and in registration with internal volumes of respective stacks of annular substrates, and nozzles inserted in passages communicating the gas preheating zone with the internal volumes of respective stacks of annular substrates for adjusting the flows of preheated gas respectively admitted in said internal volumes.

The sleeve, which is preferably formed of a massive body made in one piece of heat conductive material, achieves different functions:

- resting upon the susceptor bottom wall and being thus surrounded by the susceptor side wall, it enables an efficient heating of the preheating zone to be reached,
- it encloses the preheating zone and contributes to the sealing thereof, avoiding a large fraction of the reactive gas admitted to reach the reaction chamber without having fully passed through the gas preheater, and
- it supports the load of substrates through the gas distribution plate and load supporting plate and transfers the weight to the susceptor bottom wall without the need for a separate supporting structure for the load supporting plate.

The above contributes to the efficiency of the gas preheating and compactness of the structure located at the bottom of the furnace.

The provision of flow adjusting nozzles which may be inserted in the passages of the gas distribution plate, makes it possible to feed stacks of substrates with a larger flow of reactive gas compared to other stacks of substrates. It is thus possible to compensate for a gradient of temperature between different stacks of substrates in order to achieve a substantially uniform densification. Indeed, the deposition rate of the matrix material varies as a function of the temperature and of the flow of reactive gas.

According to a particular aspect of the invention, the heat exchange assembly of the gas preheater comprises a plurality of spaced apart plates surrounded by the sleeve and extending substantially horizontally between the susceptor bottom wall and the gas distribution plate, the plates of the heat exchange assembly being made of a heat conductive foil material. The use of foil material such as graphite foil material or of C/C composite material makes it possible to reduce the thickness of the plates, hence the bulk of the gas preheater. The plates, which may be of a substantially circular form, are then preferably spaced apart by means of radially extending spacers interposed therebetween.

According to another particular aspect of the invention, the plates of the heat exchange assembly include at least one pair of plates located one immediately above the other in which one plate has perforations only in a central part thereof and the other plate has perforations only in the peripheral part thereof. Thus, the gas is forced to follow a tortuous path, whereby an efficient preheating may be achieved within a limited volume. The gas distribution plate and the load supporting plate may be formed of one and same plate, or of two different plates located one above the other. In the latter case, a plurality of ducts are provided each for connecting a passage of the gas distribution plate to a corresponding passage of the load supporting plate. Each duct may be provided with an insert made of a heat conductive material for achieving heat exchange with reactive gas flowing in the duct and thus completing preheating of the gas.

According to a further aspect of the invention, a process is provided for controlling distribution of preheated reactive gas in a CVI furnace for densification of annular porous substrate loaded in a reaction chamber of the furnace in a plurality of vertical stacks, each stack comprising superposed substrates defining an internal volume of the stack, the reaction chamber being heated by a susceptor having an internal wall delimiting the reaction chamber, said process comprising admitting the reactive gas into a preheating zone at the bottom of the furnace, preheating the reactive gas by passing it through the preheating zone, dividing the preheated reactive gas into a plurality of separate flows at respective outlets of the preheating zone, and directing the separate flows of reactive gas into respective internal volumes of the stacks of annular substrates, wherein the separate flows of reactive gas are adjusted as a function of the location of the corresponding stacks of substrates within the reaction chamber.

Preferably, the separate flow of reactive gas directed into the internal volume of a stack of substrates located farther from the internal wall of the susceptor than another stack of substrates is larger than the separate flow of gas directed into the internal volume of said another stack of substrates.

The separate flows of reactive gas may be adjusted by inserting nozzles having different cross-sections into passages formed in a gas-distribution plate covering a gas preheating chamber in the gas preheating zone.

BRIEF DESCRIPTION OF THE DRAWINGS

Other features and advantages of the invention will appear on reading the following description given by way of non-limiting indication and with reference to the accompanying drawings in which:

FIGS. 4 to 7 are partial diagrammatic sectional views on planes IV—IV, V—V, VI—VI, and VII—VII of FIG. 3; and FIG. 8 is a diagrammatic sectional view showing a variant embodiment of a gas preheater according to the invention.

DETAILED DESCRIPTION OF EMBODIMENTS

Figure 1:
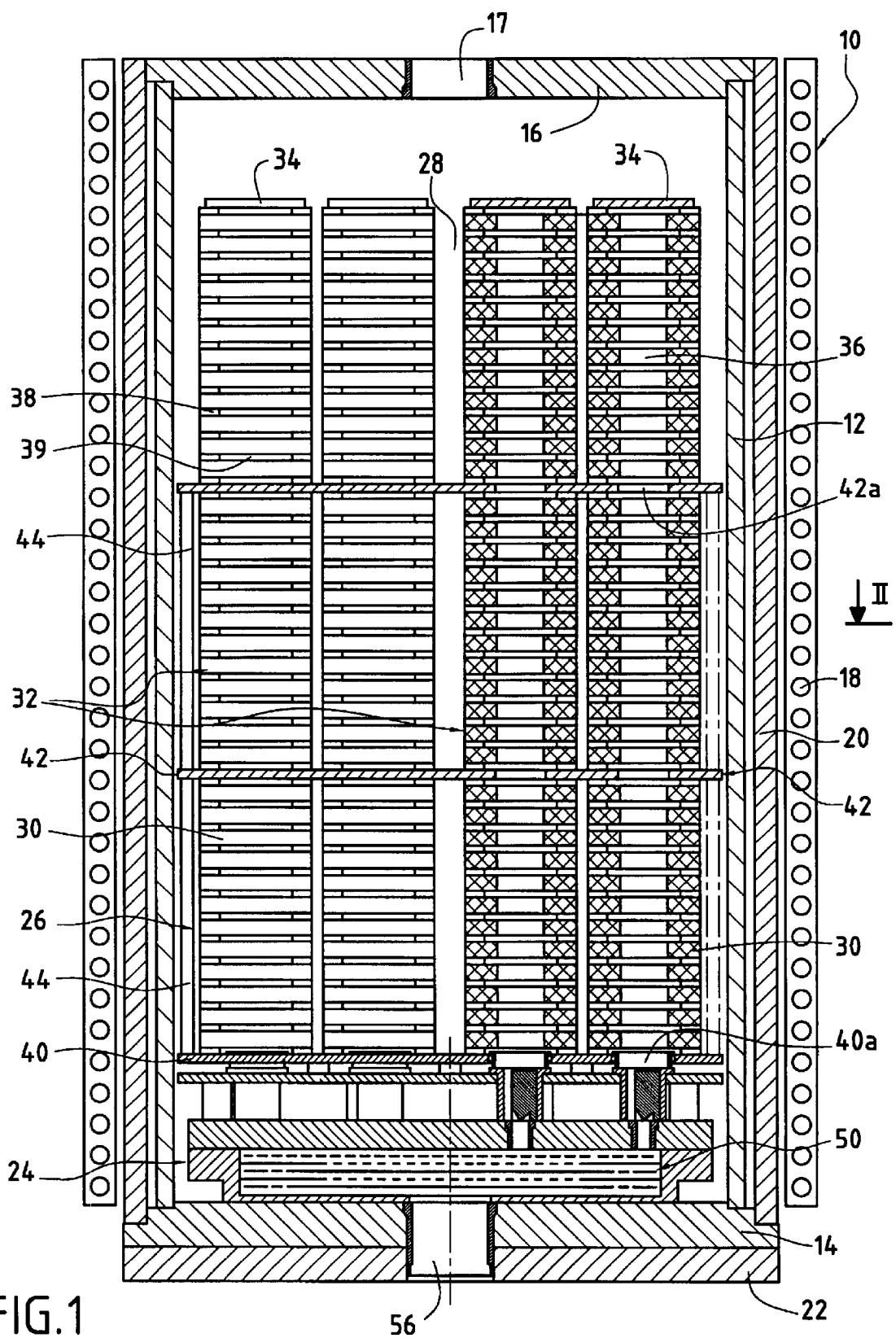
FIG. 1 is a highly diagrammatic sectional view of a CVI furnace having a gas preheater according to the invention, the section being on plane I—I of FIG. 2.
Figure 2:
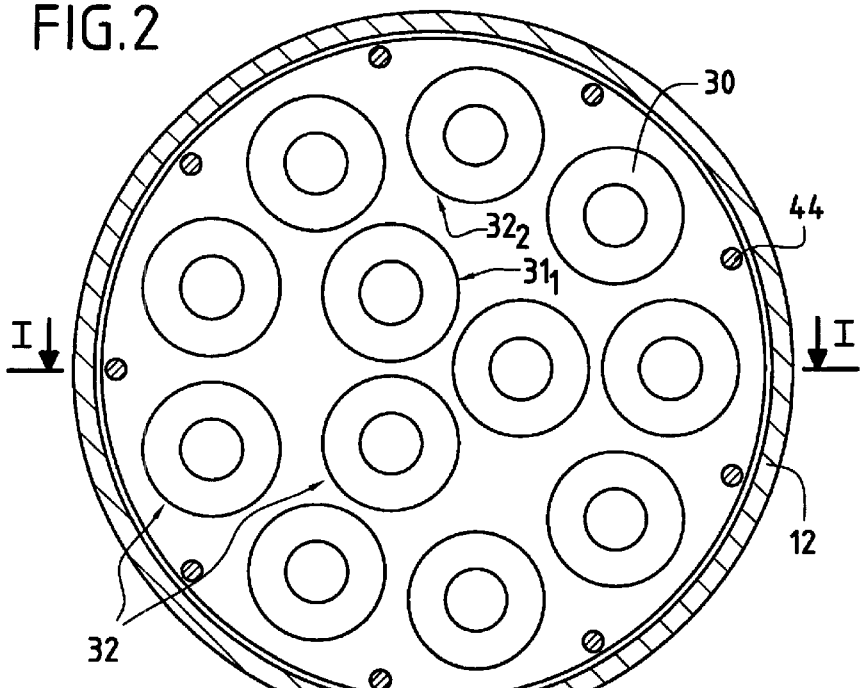
FIG. 2 is a highly diagrammatic partial sectional view on plane II—II of FIG. 1.

FIGS. 1 and 2 show a furnace 10 having a cylindrical side wall 12 formed by a susceptor, with a susceptor bottom wall 14 and a susceptor top wall 16. The susceptor 12 constitutes a secondary transformer circuit which is inductively coupled with a primary transformer circuit in the form of at least one induction coil 18. Insulation 20 is interposed between the induction coil 18 and the susceptor 12 and further insulation 22 is provided under the susceptor bottom wall 14. The furnace 10 is heated by feeding electrical current to the induction coil 18. As a variant, heating of the susceptor can be carried out by means of electrical resistors thermally coupled thereto.

The internal volume of the furnace 10 comprises a gas preheating zone 24 located at the bottom of the furnace and a reaction chamber or loading zone 26 where porous annular substrates 30 to be densified are loaded, the reaction chamber 26 being located above the preheating zone 24.

The substrates 30 to be densified may constitute carbon fiber preforms or pre-densified blanks for making brake disks out of C/C composite materials, the pre-densified blanks being obtained by pre-densification of preforms by CVI or by liquid (resin) impregnation followed by carbonization. Such C/C brake disks are commonly used for aircraft landing gears and for racing cars.

The annular substrates 30 are arranged so as to form a plurality of annular vertical stacks 32 resting on a bottom load-supporting plate 40. Each stack of substrates may be subdivided into a plurality of superposed sections that are separated by one or more intermediate plates 42, the plates 40 and 42 may be made of graphite. They have passages 40a, 42a formed therethrough in alignment with the internal passages of the substrates. The intermediate plates 42 are supported by plate 40 by means of posts 44.

In the example shown (FIG. 2), 12 stacks of substrates are provided, with 9 stacks forming a ring of regularly spaced stacks located in proximity to the susceptor 12 and 3 stacks located in the central part of the loading zone. Other arrangements may be provided, for instance including 7 stacks of substrates with 6 stacks forming a peripheral ring and 1 central stack.

Each annular stack 32 is closed at the top by a cover 34, whereby the internal volume of the reaction chamber 26 is subdivided into a plurality of stack internal volumes 36 and a volume 28 outside the stacks. Each stack internal volume is formed by the aligned central passages of the substrates 30 and intermediate plates 42.

Each substrate 30 in a stack 32 is spaced apart from an adjacent substrate, or where appropriate from a plate 40, 42 or cover 34 by spacers 38 which leave gaps 39 between substrates. The spacers 38 may be arranged to leave passages for gas between the volumes 36 and 28 via the gaps 39. These passages can be provided in such a manner as to ensure pressures in volumes 36 and 28 are in equilibrium, as described in U.S. Pat. No. 5,904,957 or in such a manner as to constitute simple leakage passages for maintaining a pressure gradient between the volumes 36 and 28.

The gas heating zone 24, which is surrounded by the susceptor, like the reaction chamber 26, encloses a gas preheater assembly 50 shown in detail by FIGS. 3 to 6.

The gas preheater assembly comprises a ring or sleeve 52 which rests on the susceptor bottom wall 14 and extends close to the susceptor side wall 12. The sleeve 52 is preferably formed of a massive body made in one piece of heat conductive material such as graphite.

The sleeve 52 delimits a gas preheating chamber 54. A passage 56 formed through bottom insulation 22 and bottom susceptor wall 14 constitutes an inlet for reactive gas opening into the gas preheating chamber 54. Gas inlet 56 is connected to a reactive gas source (not shown). As a variant, several gas inlets may be provided, all opening into the gas preheating zone. Gas inlet 56 may be provided with a screen 58 opposing radiation of heat from the gas preheating chamber.

Figure 3:
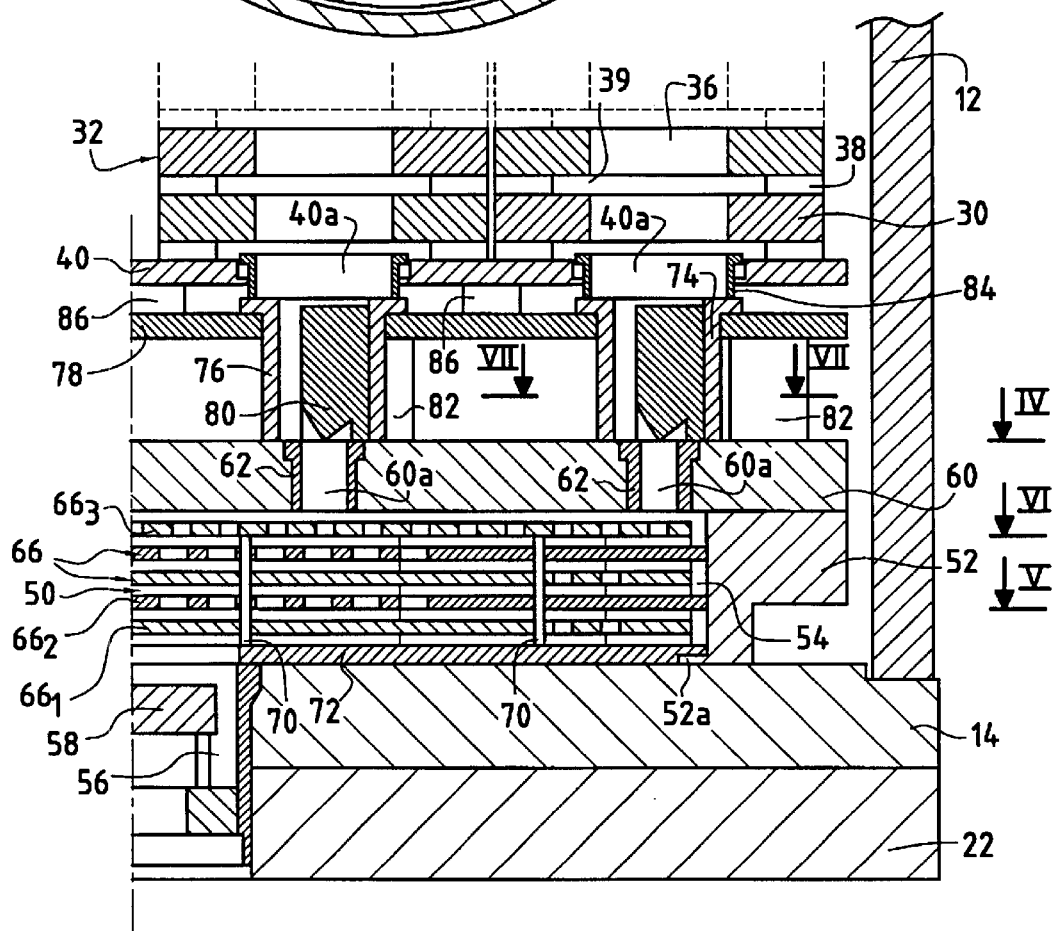
FIG. 3 is an enlarged diagrammatic partial sectional view of the gas preheater of the furnace of FIG. 1.

The gas preheating chamber 54 is covered by a gas distribution plate 60 supported by the sleeve 52 by resting upon its upper edge. The gas distribution plate has passages 60a formed therethrough in registration with the passages 40a and the internal volumes 36 of the stacks 32. As shown by FIGS. 3 and 4, each passage is provided with an insert 62 in form of a nozzle of calibrated cross-section (the locations of stacks 32 are shown in chain-dotted lines in FIG. 4).

Gas admitted through inlet 56 is preheated within the preheating chamber 54 before reaching passages 60a. Preheating is performed by forcing the gas to flow along and through a plurality of spaced apart perforated plates 66 extending horizontally between the susceptor bottom wall 14 and the gas distribution plate 60.

The perforated plates 66 may be made of a heat conductive foil material such as a graphite foil material. Use of such thin perforated plates makes it possible to reduce the bulk of the gas preheater compared with massive perforated graphite plates. As an alternative, plates 66 may be made from C/C composite material.

Figure 5:
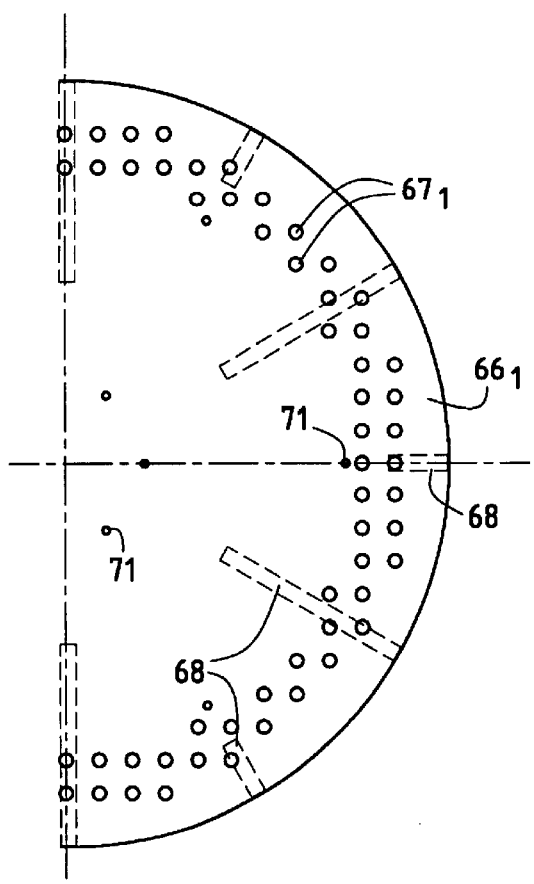
Figure 6:
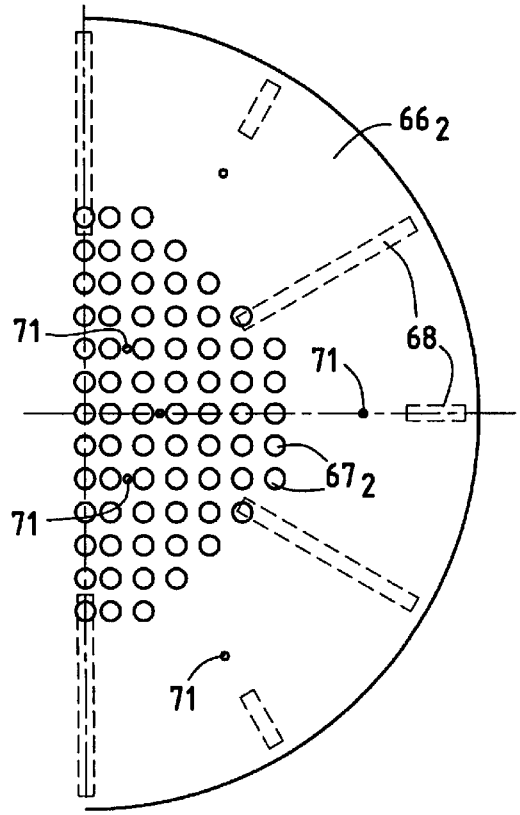

The perforated plates 66 are maintained in a spaced apart relationship by means of spacers 68, preferably in the form of radially extending graphite bars (also shown in broken lines in FIGS. 5 and 6).

Advantageously also, plates 66 include one or several pairs of plates $66_1$, $66_2$ which are located one immediately above the other, with one plate $66_2$ having perforations $67_2$ only in a central part thereof and the other plate $66_1$ having perforations $67_1$ only in a peripheral part thereof. Thus, the flow of gas is forced to flow not only across but also along the plates. The lower perforated plate is then preferably the one provided with perforations only in its peripheral part.

In order to ensure a relatively uniform output of preheated gas at the upper part of the gas preheating chamber, at least the upper perforated plate or the two upper perforated plates $66_3$ are provided with perforations regularly distributed over their surface (FIG. 3).

The plates 66 are maintained in their desired horizontal positions by means of vertical rods 70 passing through holes 71 formed in the plates. The rods 70 are carried by a bottom non-perforated plate 72 having a central passage in registration with the gas inlet 56 and resting on an internal edge 52a provided at the lower part of the sleeve 52. The sleeve 52, with plates 66, 72 and rods 70 may thus be pre-assembled before insertion into the furnace.

Figure 7:
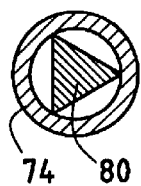

Gas exiting through passages 60a of the gas distribution plate 60 is channeled through ducts, or chimneys 74 which are inserted into passages 76 formed in a holding plate 78 in registration with passages 60a. The chimneys 74 have upper flanges resting upon the plate 78, around passages 76. Inserts 80, for example in the form of dihedrons (FIGS. 3 and 7), are provided inside the chimneys 74 for further heating the gas flowing therethrough. Chimneys 74 and inserts 80 are made of a heat conductive material, such as graphite, as well as plates 60 and 78. Plate 78 is supported by gas distribution plate 60 by means of posts 82.

The chimneys 74 communicate with the passages 40a of the load supporting plate 40. Rings 84 are inserted in passages 40a and rest upon the upper edge of chimneys 74 for channeling the flow of gas between plates 78 and 40. Plate 40 is supported by plate 78 by means of posts 86.

In operation, stacks of substrates are loaded into the reaction chamber, over the gas preheater. The weight of the load is supported by the susceptor bottom wall through plates 40, 78, 60, posts 86, 82, and sleeve 52. The susceptor bottom wall 14 rests upon posts (not shown) which support the whole furnace.

The furnace is heated by the susceptor in order to bring the substrates loaded in the reaction chamber to the required temperature. The elements of the load supporting structure and of the gas preheater are similarly heated.

After the desired temperature within the furnace has been reached, reactive gas is admitted through gas inlet 56. The gas is preheated by flowing along and across the perforated plates 66 in the preheating chamber 54. Use of a massive graphite sleeve 52 having high thermal inertia and made in one piece contributes to an efficient heating and sealing of the gas preheating chamber.

The preheated gas leaves the preheating chamber 54 through nozzles 62 and is further heated by heat exchange with the walls of chimneys 74 and inserts 80, before reaching the internal volumes of the stacks of substrates.

An efficient preheating of the reactive gas is thus achieved, minimizing the temperature gradient between the lower part of each stack and the rest of the stack.

The gas admitted into the internal volume 36 of a stack of substrates reaches volume 28 of the reaction chamber by diffusing through the porosity of the substrates—and forming the desired matrix constituting deposit—and eventually passing through gaps 39. The effluent gas is extracted from the volume 28 of the reaction chamber through a gas outlet 17 formed in the susceptor top wall 16 and connected to a pumping device (not shown).

Advantageously, the division of the flow of preheated reactive gas into individual flows feeding the internal volumes of the stacks of substrates is controlled as a function of the location of the stack in the reaction chamber. The control is performed in order to allow a larger flow of reactive gas to feed a stack which is remote from the internal wall 12 of the susceptor, in comparison with the flow of reactive gas feeding a stack located close to the internal wall of the susceptor.

Indeed, a stack of substrates located in the central part of the reaction chamber, like stack $32_1$, in FIG. 2, is slightly less efficiently heated by the susceptor compared with a stack of substrates located close to the internal wall of the susceptor, like stack $32_2$. Slightly increasing the flow of reactive gas feeding stack $32_1$ makes it possible to compensate for the slightly less efficient heating and reduce the gradient of densification between different stacks.

The individual flows of reactive gas feeding the different stacks are controlled by selecting the cross-section of the passages defined by the nozzles 62. As shown by FIG. 4, a nozzle $62_1$ for a central stack (like stack $32_1$) defines a passage having a cross-section slightly larger than the cross-section of a passage defined by a nozzle $62_2$ for a peripheral stack (like stack $32_2$). Different sets of nozzles 62 having the same outer diameter corresponding to the diameter of passages 60a, but different internal calibrated cross-section may be provided to allow appropriate selection for adjusting the individual flows of gas as needed.

Another, simplified, embodiment of a gas preheater according to the invention is diagrammatically shown in FIG. 8.

The embodiment of FIG. 8 differs from the one of FIG. 3 in that the stacks 32 of annular preforms 30 are supported directly by plate 60 which constitutes both a gas distribution plate and a load supporting plate.

This alternate embodiment may be used when the efficiency of the gas preheating chamber is sufficient to avoid having further preheating of the individual gas flows exiting therefrom. Efficiency of the gas preheating chamber 54 may be adjusted by selecting an appropriate number of perforated plates 66.

What is claimed is:

1. In a CVI furnace for the densification of annular porous substrates arranged in a plurality of vertical annular stacks of substrates, comprising a susceptor having an internal side wall delimiting a gas preheating zone and a reaction chamber within the furnace and a bottom wall, and at least one gas inlet opening through the bottom wall of the susceptor, a gas preheater comprising:

a sleeve made of heat conductive material resting upon the susceptor bottom wall and delimiting a gas preheating chamber, with the at least one gas inlet opening in the gas preheating chamber, a heat exchange assembly located in the gas preheating chamber, a gas distribution plate resting upon the sleeve, covering the gas preheating chamber and provided with a plurality of passages for pre-heated gas, a load supporting plate for supporting stacks of annular substrates to be loaded in the reaction chamber for densification and provided with a plurality of passages in communication with respective passages of the gas distribution plate and in registration with internal volumes of respective stacks of annular substrates, and nozzles inserted in passages communicating the gas preheating zone with the internal volumes of respective stacks of annular substrates for adjusting the flows of preheated gas respectively admitted in said internal volumes.

2. A gas preheater as claimed in claim 1, wherein the gas distribution plate and the load supporting plate are formed of one and the same plate.

3. A gas preheater as claimed in claim 1, wherein the load supporting plate is separate from and located above the gas distribution plate, and a plurality of ducts are provided for connecting the passages of the gas distribution plate to respective passages of the load supporting plate.

4. A gas preheater as claimed in claim 3, wherein said ducts are provided with inserts made of heat conducting material for heat exchange with gas flowing in the ducts.

5. A gas preheater as claimed in claim 1, wherein the load supporting plate is supported by the gas distribution plate.

6. A gas preheater as claimed in claim 1, wherein the flow adjusting nozzles are inserted in the passages of the gas distribution plate.

7. A gas preheater as claimed in claim 1, wherein said sleeve is formed of a massive body made in one piece of heat conductive material.

8. A gas preheater as claimed in claim 1, wherein said heat exchange assembly comprises a plurality of spaced apart perforated plates surrounded by the sleeve and extending substantially horizontally between the susceptor bottom wall and the gas distribution plate, the plates of the heat exchange assembly being made of a heat conductive foil material.

9. A gas preheater as claimed in claim 8, wherein the plates of the heat exchange assembly are substantially circular and are spaced apart by means of radially extending spacers interposed therebetween.

10. A gas preheater as claimed in claim 1, wherein said heat exchange assembly comprises a plurality of spaced apart perforated plates surrounded by the sleeve and extending substantially horizontally between the susceptor bottom wall and the gas distribution plate, the plates of the heat exchange assembly including at least one pair of plates located one immediately above the other in which one plate has perforations only in a central part thereof and the other has perforations only in a peripheral part thereof.

11. A process according to claim 1, wherein the separate flow of reactive gas directed into the internal volume of a stack of substrates located farther from the internal wall of the susceptor than another stack of substrates is larger than the separate flow of gas directed into the internal volume of said another stack of substrates.

12. A process according to claim 1, wherein the separate flows of reactive gas are adjusted by inserting nozzles having different cross-sections into passages formed in a gas-distribution plate covering a gas preheating chamber in the gas preheating zone.

13. In a CVI furnace for the densification of annular porous substrates arranged in a plurality of vertical annular stacks of substrates, comprising a susceptor having an internal side wall delimiting a gas preheating zone and a reaction chamber within the furnace and a bottom wall, and at least one gas inlet opening through the bottom wall of the susceptor, a gas preheater comprising:

a sleeve made of heat conductive material resting upon the susceptor bottom wall and delimiting a gas preheating chamber, with at least one gas inlet opening in the gas preheating chamber, a gas distribution plate resting upon the sleeve, covering the gas preheating chamber and provided with a plurality of passages for preheated gas, a load supporting plate for supporting stacks of annular substrates to be loaded in the reaction chamber for densification and provided with a plurality of passages in communication with respective passages of the gas distribution plate and in registration with internal volumes of respective stacks of annular substrates, and a heat exchange assembly having a plurality of spaced apart and substantially circular plates surrounded by the sleeve and extending substantially horizontally between the susceptor bottom wall and the gas distribution plate, the plates of the heat exchange assembly being made of a heat conductive foil material, and being spaced apart by means of radially extending spacers interposed therebetween.

14. In a CVI furnace for the densification of annular porous substrates arranged in a plurality of vertical annular stacks of substrates, comprising a susceptor having an internal side wall delimiting a gas preheating zone and a reaction chamber within the furnace and a bottom wall, and at least one gas inlet opening through the bottom wall of the susceptor, a gas preheater comprising:

a sleeve made of heat conductive material resting upon the susceptor bottom wall and delimiting a gas preheating chamber, with at least one gas inlet opening in the gas preheating chamber, a gas distribution plate resting upon the sleeve, covering the gas preheating chamber and provided with a plurality of passages for preheated gas, a load supporting plate for supporting stacks of annular substrates to be loaded in the reaction chamber for densification and provided with a plurality of passages in communication with respective passages of the gas distribution plate and in registration with internal volumes of respective stacks of annular substrates, and a heat exchange assembly having a plurality of spaced apart perforated plates surrounded by the sleeve and extending substantially horizontally between the susceptor bottom wall and the gas distribution plate, the plates of the heat exchange assembly including at least one pair of plates located one immediately above the other in which one plate has perforations only in a central part thereof and the other has perforations only in a peripheral part thereof.

15. In a CVI furnace for the densification of annular porous substrates arranged in a plurality of vertical annular stacks of substrates, comprising a susceptor having an internal side wall delimiting a gas preheating zone and a reaction chamber within the furnace and a bottom wall, and at least one gas inlet opening through the bottom wall of the susceptor, a gas preheater comprising:

a sleeve made of heat conductive material resting upon the susceptor bottom wall and delimiting a gas preheating chamber, with at least one gas inlet opening in the gas preheating chamber, a gas distribution plate resting upon the sleeve, covering the gas preheating chamber and provided with a plurality of passages for preheated gas, a load supporting plate for supporting stacks of annular substrates to be loaded in the reaction chamber for densification and provided with a plurality of passages in communication with respective passages of the gas distribution plate and in registration with internal volumes of respective stacks of annular substrates, and a plurality of spaced apart perforated plates surrounded by the sleeve and extending substantially horizontally between the susceptor bottom wall and the gas distribution plate, the plates of the heat exchange assembly including at least one pair of plates located one immediately above the other in which one plate has perforations only in a central part thereof and the other has perforations only in a peripheral part thereof, and the plates of the heat exchange assembly being made of a heat conductive foil material and being substantially circular -and spaced apart by means of radially extending spacers interposed therebetween.

16. In a CVI furnace for the densification of annular porous substrates arranged in a plurality of vertical annular stacks of substrates, comprising a susceptor having an internal side wall delimiting a gas preheating zone and a reaction chamber within the furnace and a bottom wall, and at least one gas inlet opening through the bottom wall of the susceptor, a gas preheater comprising:

a sleeve made of heat conductive material resting upon the susceptor bottom wall and delimiting a gas preheating chamber, with at least one gas inlet opening in the gas preheating chamber, a heat exchange assembly located in the gas preheating chamber and comprising a plurality of spaced apart perforated plates surrounded by the sleeve and extending substantially horizontally between the susceptor bottom wall and the gas distribution plate, the plates of the heat exchange assembly including at least one pair of plates located one immediately above the other in which one plate has perforations only in a central part thereof and the other has perforations only in a peripheral part thereof, and the plates of the heat exchange assembly being made of a heat conductive foil material and being substantially circular and spaced apart by means of radially extending spacers interposed therebetween, a gas distribution plate resting upon the sleeve, covering the gas preheating zone and provided with a plurality of passages for preheated gas, a load supporting plate for supporting stacks of annular substrates to be loaded in the reaction chamber for densification and provided with a plurality of passages in communication with respective passages of the gas distribution plate and in registration with internal volumes of respective stacks of annular substrates, and nozzles inserted in passages communicating the gas preheating zone with the internal volumes of respective stacks of annular substrates for adjusting the flows of preheated gas respectively admitted in said internal volumes.

17. A process for controlling distribution of preheated reactive gas in a CVI furnace for densification of annular porous substrate loaded in a reaction chamber of the furnace in a plurality of vertical stacks, each stack comprising superposed substrates defining an internal volume of the stack, the reaction chamber being heated by a susceptor having an internal wall delimiting the reaction chamber, said process comprising admitting the reactive gas into a preheating zone at the bottom of the furnace, preheating the reactive gas by passing it through the preheating zone, dividing the preheated reactive gas into a plurality of separate flows at respective outlets of the preheating zone, and directing the separate flows of reactive gas into respective internal volumes of the stacks of annular substrates, wherein the separate flows of reactive gas are adjusted as a function of the location of the corresponding stacks of substrates within the reaction chamber.

* * * * *